(12) United States Patent
Wang et al.

(10) Patent No.: US 10,139,977 B2
(45) Date of Patent: Nov. 27, 2018

(54) TOUCH DISPLAY DEVICE AND METHOD OF DRIVING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengpeng Wang, Beijing (CN); Xue Dong, Beijing (CN); Haisheng Wang, Beijing (CN); Xiaochuan Chen, Beijing (CN); Xiaoliang Ding, Beijing (CN); Yingming Liu, Beijing (CN); Shengji Yang, Beijing (CN); Weijie Zhao, Beijing (CN); Changfeng Li, Beijing (CN); Wei Liu, Beijing (CN); Hongjuan Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/504,538

(22) PCT Filed: Aug. 17, 2016

(86) PCT No.: PCT/CN2016/095641
§ 371 (c)(1),
(2) Date: Feb. 16, 2017

(87) PCT Pub. No.: WO2017/092404
PCT Pub. Date: Jun. 8, 2017

(65) Prior Publication Data
US 2018/0260047 A1    Sep. 13, 2018

(30) Foreign Application Priority Data

Nov. 30, 2015 (CN) .......................... 2015 1 0855988

(51) Int. Cl.
*G06F 3/00* (2006.01)
*G06F 3/044* (2006.01)
(Continued)

(52) U.S. Cl.
CPC ............ *G06F 3/044* (2013.01); *G06F 3/0414* (2013.01); *H01L 27/323* (2013.01); *H01L 51/5221* (2013.01)

(58) Field of Classification Search
CPC ..... G06F 3/044; G06F 3/0414; H01L 27/323; H01L 51/5221
See application file for complete search history.

(56) References Cited

U.S. PATENT DOCUMENTS

2012/0249454 A1* 10/2012 Teraguchi ............. G06F 3/0412
                                                       345/173
2014/0104199 A1    4/2014 Lee et al.
(Continued)

FOREIGN PATENT DOCUMENTS

CN          103050506 A      4/2013
CN          104779267 A      7/2015
(Continued)

OTHER PUBLICATIONS

First Office Action for Chinese Application No. 201510855988.4, dated Dec. 19, 2017, 7 Pages.
International Search Report and Written Opinion for Application No. PCT/CN2016/095641, dated Nov. 23, 2016, 9 Pages.

*Primary Examiner* — Muhammad N Edun
(74) *Attorney, Agent, or Firm* — Brooks Kushman P.C.

(57) ABSTRACT

A touch display device and a method of driving the same are provided. The touch display device includes a metal layer and a plurality of organic light-emitting unit groups. Each of the plurality of organic light-emitting unit groups includes a plurality of organic light-emitting units and the organic light-emitting units of each of the plurality of organic (Continued)

light-emitting unit groups shares one of the plurality of cathodes, the plurality of cathodes are insulated from each other, and each of the plurality of cathodes forms a capacitive pressure sensor with the metal layer.

20 Claims, 4 Drawing Sheets (51) Int. Cl.
    *H01L 27/32*     (2006.01)
    *H01L 51/52*     (2006.01)
    *G06F 3/041*     (2006.01)

(56) References Cited

U.S. PATENT DOCUMENTS

| | | | |
|---|---|---|---|
| 2014/0210736 A1* | 7/2014 | Jeon | G06F 3/0412 |
| | | | 345/173 |
| 2015/0160767 A1* | 6/2015 | Song | G06F 3/0412 |
| | | | 345/174 |
| 2017/0060302 A1 | 3/2017 | Yang et al. | |

FOREIGN PATENT DOCUMENTS

| | | |
|---|---|---|
| CN | 105094491 A | 11/2015 |
| CN | 205122587 U | 3/2016 |
| CN | 105702205 A | 6/2016 |
| JP | 2014081910 A | 5/2014 |

\* cited by examiner

FIG. 7B

TOUCH DISPLAY DEVICE AND METHOD OF DRIVING THE SAME

CROSS-REFERENCE TO RELATED APPLICATIONS

This application is the U.S. national phase of PCT Application No. PCT/CN2016/095641 filed on Aug. 17, 2016, which claims priority to Chinese Patent Application No. 201510855988.4 filed on Nov. 30, 2015, the disclosures of which are incorporated in their entirety by reference herein.

TECHNICAL FIELD

The present disclosure relates to the field of display technology, in particular to a touch display device and a method of driving the same.

BACKGROUND

Compared with liquid crystal displays (LCDs), organic light-emitting diodes (OLEDs) have the advantages of low energy consumption, low production cost, self-illuminating, wide viewing angle and fast response speed, etc. Currently, in mobile phones, Tablet personal computers, Personal Digital Assistants (PDAs), and digital cameras and other display areas, OLEDs begin to replace the traditional LCDs. In particular, active matrix OLED (AMOLED) has become one of the hotspots in the field of flat panel display. Pixel driving circuit design is the core technology of AMOLED display, which has important research significance.

Force touch is a technology that detects external forces, and has long been used in industrial control, medical treatment and other fields. Led by Apple Inc., many companies are looking for the right solution to apply Force Touch in the field of display, especially to apply Force Touch in the field of mobile phone or tablet personal computer, which allows customers to get a better human-machine interaction experience. However, design schemes in the related art additionally require a detecting mechanism to be disposed, and have limited pressure detection accuracy due to large assembly tolerance.

SUMMARY

The present disclosure aims to provide a touch display device without an additional detection mechanism and a method of driving the same so as to achieve the Force Touch function of the display device. Since the additional detection mechanism is not needed, the large assembly tolerance is avoided, improving the accuracy of the touch display device.

To this end, in a first aspect, the present disclosure provides a touch display device, including: a metal layer; a cathode layer; and a plurality of organic light-emitting unit groups. The cathode layer includes a plurality of cathodes, each of the plurality of organic light-emitting unit groups includes a plurality of organic light-emitting units and the plurality of organic light-emitting units in each of the plurality of organic light-emitting unit groups shares one of the plurality of cathodes, the cathodes corresponding to the plurality of organic light-emitting unit groups are insulated from each other, and each of the plurality of cathodes forms a capacitive pressure sensor with the metal layer.

Optionally, the touch display device further includes a display area and a non-display area around the display area. Each of the plurality of cathodes includes a touch electrode and a signal lead configured to transmit an electrical signal, an end of the signal lead is electrically connected to the touch electrode and an opposite end of the signal lead extends to the non-display area.

Optionally, the signal leads extending towards four sides of the non-display area respectively are of an identical number.

Optionally, the signal lead and the touch electrode are arranged at an identical layer.

Optionally, the signal lead and the touch electrode are arranged at different layers.

Optionally, the metal layer includes a metal plate on a middle frame of the touch display device, and the metal layer is arranged at a side of the cathode layer away from the plurality of organic light-emitting units, an encapsulation layer configured to encapsulate the plurality of organic light-emitting units is arranged between the metal layer and the cathode layer, and a gap with a predetermined height exists between the metal layer and the cathode layer.

Optionally, the metal layer is spaced apart from the encapsulation layer.

Optionally, a material of the cathode includes metal.

Optionally, the touch display device further includes: a driving module, a detecting module and a processing module. The driving module is configured to apply a pressure scanning signal to each of the plurality of cathodes during a pressure scanning stage. The detecting module is configured to detect capacitance change data of a capacitor formed between each of the plurality of cathodes and the metal layer during the pressure scanning stage. The processing module is configured to determine a corresponding pressure value based on the capacitance change data and a correspondence between capacitance change data and a pressure value.

Optionally, the driving module is further configured to apply a common signal to each of the plurality of cathodes during a display stage.

In another aspect, the present disclosure further provides a method of driving the touch display device hereinabove. The method includes: applying a common signal to each of the plurality of cathodes during a display stage; applying a pressure scanning signal to each of the plurality of cathodes during a pressure scanning stage; detecting capacitance change data of a capacitor formed between each of the plurality of cathodes and the metal layer during the pressure scanning stage; and determining a corresponding pressure value based on the capacitance change data and a correspondence between capacitance change data and a pressure value.

Optionally, the capacitance change data includes a charging time duration required for charging the capacitor to reach a predetermined voltage value, and the correspondence includes a first correspondence which is a correspondence between the charging time duration and the pressure value, and the determining a corresponding pressure value includes determining the pressure value corresponding to the charging time duration based on the charging time duration and the first correspondence.

Optionally, the capacitance change data includes a voltage value which a capacitor in a charging state reaches at an end of a predetermined charging time duration, and the correspondence includes a second correspondence which is a correspondence between the voltage value and the pressure value, and the determining a corresponding pressure value includes determining the pressure value corresponding to the voltage value based on the voltage value and the second correspondence.

Compared with the related art, the touch display device and the method of driving the same divide the organic light-emitting units in the touch display device into groups, each group of the organic light-emitting units share one cathode, and the cathodes are insulated from each other, so that each of the cathode forms a capacitive pressure sensor with the metal layer. By using this touch display device, the Force Touch device and the display device are integrated, reducing the manufacturing costs. Further, the additional detection mechanism is not needed, and thus the large assembly tolerance is avoided, improving the accuracy of the touch display device.

DETAILED DESCRIPTION

The technical solutions of the embodiments of the present disclosure will be clearly and completely described below with reference to the accompanying drawings of the embodiments of the present disclosure. Apparently, the described embodiments are only part of the embodiments of the present disclosure, but not all the embodiments. All other embodiments obtained by a person of ordinary skills in the art without any creative work based on the embodiments of the present disclosure are intended to be within the scope of the present disclosure.

At present, most smart phones, PAD or digital cameras use OLED displays to display interfaces. In particular, many smart phones use AMOLED displays (these devices have the function of displaying images, and hereinafter are referred to as display devices). The structure of the display device will be briefly illustrated using the smart phone having the AMOLED display as an example.

Figure 1:
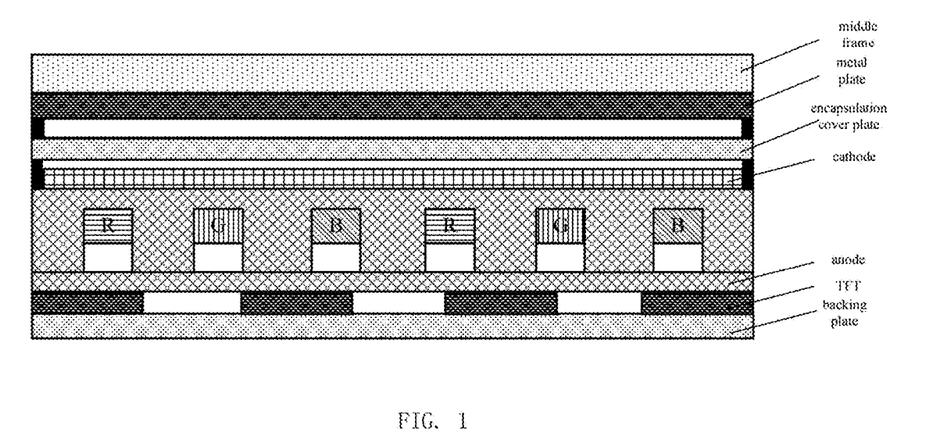
FIG. 1 is a schematic diagram of a display device in a smart phone in the related art.

Referring to FIG. 1, a schematic diagram of a display device in a smart phone in the related art is shown. As can be seen from FIG. 1, the cathode of the organic light-emitting unit in the display device has a complete planar structure and is disposed corresponding to the anode of the organic light-emitting unit. Such structure cannot sense the touch pressure exerted by the user on the touch screen (i.e., the lower surface of the backing glass in FIG. 1).

It also can be seen that the cathode of the organic light-emitting unit in the display device in the related art has a complete planar structure, and is not effectively used so that the related art disposes a Force Touch detection device at the middle frame of the display device to achieve the detection of the touch pressure.

In view of this, a touch display device is provided in some embodiments of the present disclosure. The device includes: a metal layer and a plurality of organic light-emitting unit groups. Each of the organic light-emitting unit groups includes a plurality of organic light-emitting units and the organic light-emitting units in each of the organic light-emitting unit groups shares a cathode. Those cathodes are insulated from each other. Each of the cathodes forms a capacitive pressure sensor with the metal layer.

In a practical application, the organic light-emitting unit may be an organic light emitting diode. For the display device as shown in FIG. 1, the organic light emitting diodes in FIG. 1 are divided into a plurality of groups, and the organic light emitting diodes in each of the organic light emitting diode groups share a cathode, and those cathodes are insulated from each other.

Since the cathode (also called the cathode layer) in the related art has a complete planar structure and is not effectively used, the embodiments of the present disclosure form a plurality of cathodes (also called small cathodes) insulated from each other in forming the cathode layer, and each of the cathodes forms a capacitor structure with the preset metal layer in the touch display device. The distance between two plates of the capacitor structure becomes smaller when the pressure of a touch operation is applied and the capacitance is increased. If the pressure is small, the increment in the capacitance is small, and if the pressure is large, the increment in the capacitance is large. According to this detection principle, the magnitude of the touch pressure may be detected. By using this touch display device, the Force Touch device and the display device are integrated and the structure of the display device in the related art does not need to be modified, reducing the manufacturing costs. Further, the additional detection mechanism is not needed, and thus the large assembly tolerance is avoided, improving the accuracy of the touch display device.

Figure 2:
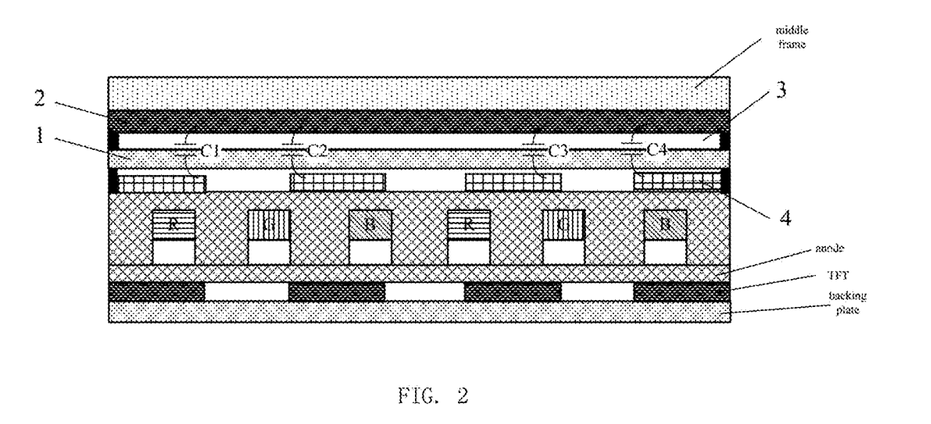
FIG. 2 is a schematic diagram of a touch display device in some embodiments of the present disclosure.

In some embodiments of the present disclosure, the metal layer may be a metal plate on the middle frame of the touch display device. The metal layer is disposed in the direction that the cathode layer faces away from the organic light-emitting units. An encapsulation layer for encapsulating the organic light-emitting units and a gap with a predetermined height are disposed between the metal layer and the cathode layer. For ease of understanding, reference is made to FIG. 2 (FIG. 2 is a schematic diagram of a touch display device according to some embodiments of the present disclosure). As shown in FIG. 2, the touch display device adopts organic light emitting diodes as the organic light-emitting units, an encapsulation cover plate 1 is disposed on the cathodes of the organic light emitting diodes, a gap 3 of a certain height is reserved between the cover plate 1 and a metal plate 2, four cathodes 4 and the metal plate 2 (i.e., the metal layer) form four capacitor structures C1, C2, C3, C4 which are equivalent to four pressure sensors. Naturally, FIG. 2 merely illustrates the capacitor structure by way of example, but is not intended to limit the number of the capacitor structures (corresponding to the number of the cathodes). In a practical application, the number of the cathodes to be designed depends on the actual touch sensitivity requirements.

That is, the cathode layer in the related art is divided into numerous small cathodes (i.e., the above-mentioned cathodes) in a cathode-reusing manner, and each of the small cathodes is used as a pressure sensor. This pressure sensor forms a capacitor with the metal plate of the middle frame of the display device such as a mobile phone. When a finger presses a screen surface (the surface on the backing plate side in FIG. 2), the pressing force of the finger is sensed by means of the change in the capacitance of the capacitor formed by the pressure sensor and the metal plate of the middle frame 5, thereby realizing the pressure detection. This approach applies the pressure sensing technology inside the display device, thereby improving the added value of the products.

In addition, since the plurality of pressure sensors constituted by the plurality of cathodes is distributed across the display area, there is no blind spot of detection for the Force Touch function. The Force Touch function is achieved through the change in the capacitance, and thus the pressure of the finger may be distinguished by detecting the charging time of the capacitor or the pressing force of the finger may be determined by detecting the amount of charges charged in the capacitor during a period T, thereby obtaining a continuous and smooth user experience.

In some embodiments of the present disclosure, the touch display device includes a display area and a non-display area around the display area. Since at least one plate of the capacitor structure needs to be charged during the operating state of the above-mentioned capacitor structure, a charging terminal for receiving an electrical signal input needs to be set for the at least one plate. Based on this, in an optional embodiment, each of the cathodes includes a touch electrode and a signal lead for transmitting an electrical signal. One end of the signal lead is connected to the touch electrode and another end of the signal lead extends to the non-display area.

Apparently, the forgoing describes charging the touch electrode through the signal lead, and the signal lead may be formed in the same layer as the touch electrode, but other approaches may be adopted in a practical application. For example, the touch electrode may be connected and charged in different layers through a via-hole.

Figure 3:
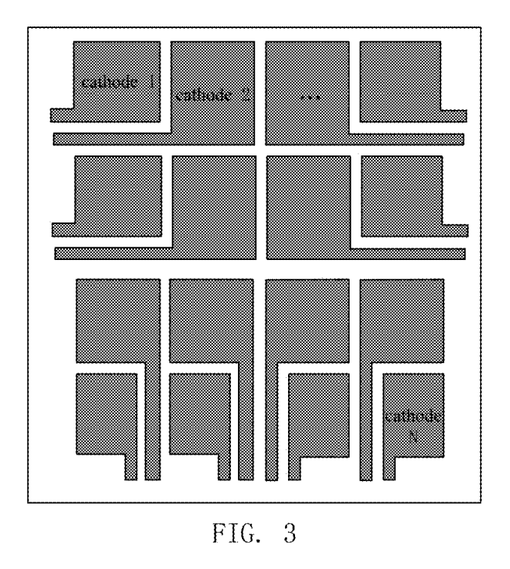
FIG. 3 is a schematic diagram of a cathode in some embodiments of the present disclosure.

For ease of understanding, referring to FIG. 3 (FIG. 3 is a schematic diagram of a shape of a cathode according to some embodiments of the present disclosure), it is possible to use a single mask to form a whole pattern by adopting the approach of using the signal lead to charge the capacitor.

Further, in some embodiments of the present disclosure, based on the approach of using the signal lead to charge the capacitor, the signal leads extending towards four sides of the non-display area respectively are of an identical number. This design is advantageous, for example, all the signal leads may be distributed uniformly and process difficulties caused by part of the signal leads which are over-concentrated may be avoided. A more apparent effect is: since the number of the cathodes (i.e., the number of the touch plates) is large and the signal lead has a width although the width is not large, the signal leads of all the internally positioned touch electrodes pass through the touch electrodes near the edges, and numerous signal leads necessarily occupy a region of a certain area so that the areas of the touch electrodes near the edges are too small and the areas of the formed capacitor plates are unequal, thereby increasing the difficulty in the control of capacitor charging.

In a practical application, the material of the cathode includes ITO or a metal. In some embodiments of the present disclosure, the cathode includes a metal, and the cathode (layer) in the AMOLED display based on the bottom emitting principle is metallic, and thus some embodiments of the present disclosure may be better applied to the display device including the AMOLED display, and other types of displays are not excluded.

The pressure sensing capacitor structure for detecting the touch pressure in the touch display device has been described above, and other functions of the above-mentioned touch display device will be described with reference to FIGS. 4 and 5. The touch display device includes both the display function and the Force Touch function, and correspondingly, the operating signal includes two operating stages, i.e., a display stage and a pressure scanning stage.

Figure 4:
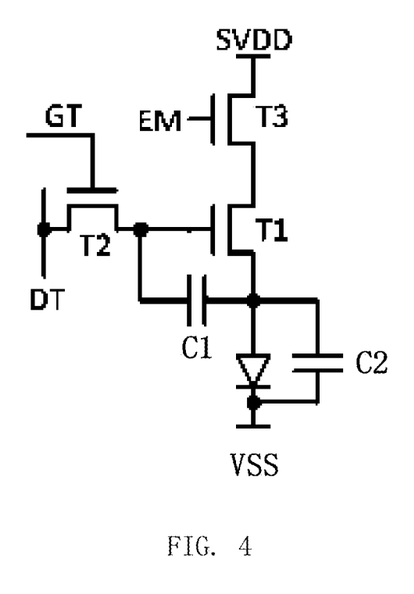
FIG. 4 is a schematic diagram of a pixel circuit in some embodiments of the present disclosure.

As shown in FIG. 4 (FIG. 4 is a schematic diagram of a pixel circuit according to some embodiments of the present disclosure), for the display stage, T1 T3 denote Switching TFTs, DT denotes a data signal, GT and EM denote scanning signals for controlling the on/off state of the Switching TFTs. The display stage is substantially the same as a traditional design, and thus will not be described in detail herein.

Figure 5:
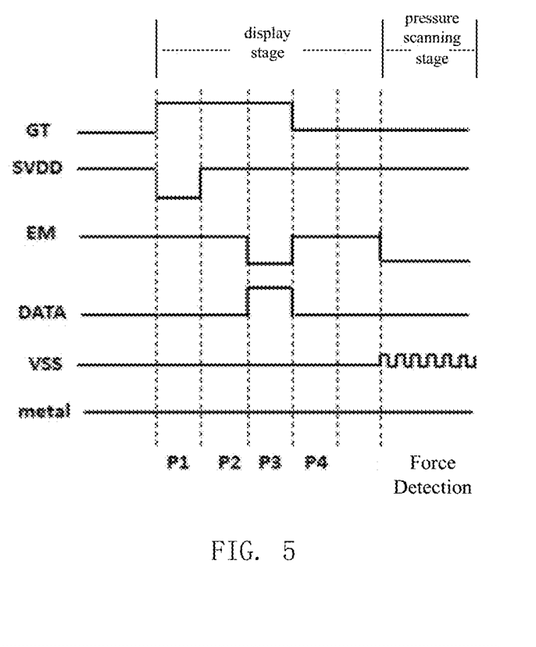
FIG. 5 is a schematic timing diagram of a driving signal in some embodiments of the present disclosure.

FIG. 5 is a schematic timing diagram of a driving signal according to some embodiments of the present disclosure. As shown in FIG. 5, for the pressure scanning stage, stages P1-P4 are the display stage and the pressure scanning stage follows the display stage. During the pressure sensing stage, square signals are inputted into the cathodes (Sensors) and the touch pressure is detected by detecting the capacitance change data of the capacitor formed by the Sensors and the middle frame. In addition, it also can be seen from FIG. 5 that when the signal EM is at the low level, T3 as shown in FIG. 4 is at the off state and the AMOLED does not emit light, thereby eliminating the affect on the display during the pressure detecting process of this stage.

Based on the two different operating stages, the above-mentioned touch display device includes: a driving module configured to apply a pressure scanning signal to each of the cathodes during the pressure scanning stage (the signal timing of the VSS in FIGS. 4 and 5 during the pressure scanning stage); a detecting module configured to detect capacitance change data of the capacitor formed between the metal layer and each of the cathodes; a processing module configured to determine the corresponding pressure value based on the above-mentioned capacitance change data and the correspondence between capacitance data and pressure values. Furthermore, the driving module is also configured to apply a common signal to each of the cathodes during the display stage (the signal timing of the VSS in FIGS. 4 and 5 during the display stage).

Figure 6:
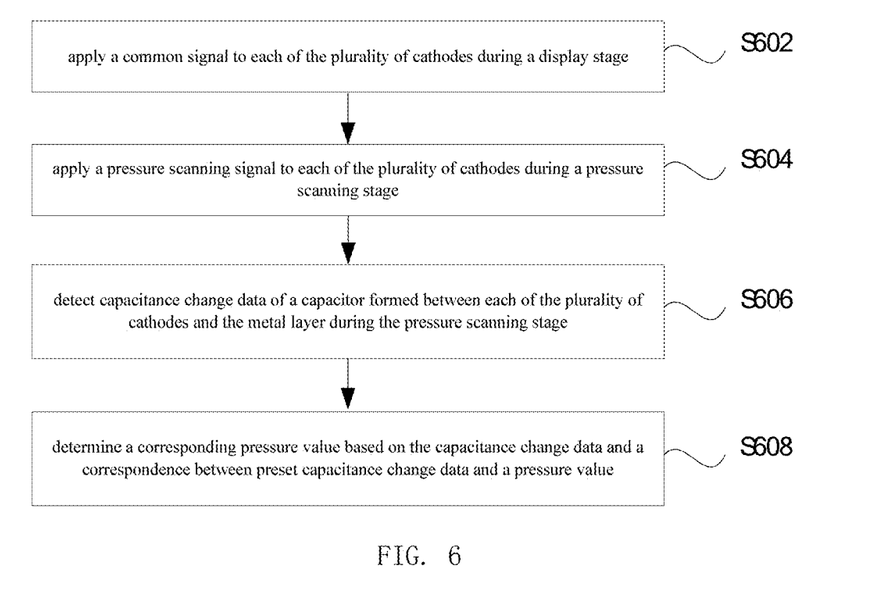
FIG. 6 is a flow chart of a method of driving a touch display device in some embodiments of the present disclosure.

A method of driving the touch display device hereinabove is provided in some embodiments of the present disclosure. FIG. 6 is a flow chart of a method of driving a touch display device in some embodiments of the present disclosure. As shown in FIG. 6, the method includes the following steps (steps S602-S608):

Step S602, during the display stage, apply a common signal to each of the cathodes;

Step S604, during the pressure scanning stage, apply a pressure scanning signal to each of the cathodes;

Step S606, during the pressure scanning stage, detecting capacitance change data of the capacitor formed between each of the cathodes and the metal layer;

Step S608, determine the corresponding pressure value based on the capacitance change data and the correspondence between capacitance change data and pressure values.

In some embodiments of the present disclosure, based on different capacitance change data, the step S608 may be realized in the following two approaches.

In a first approach, the capacitance change data includes a charging time duration for charging the capacitor to a predetermined voltage value, and the correspondence includes a first correspondence which is the correspondence between the charging time duration and the pressure value. In this case, in determining the corresponding pressure value, it is possible to determine the pressure value corresponding to the charging time duration based on the charging time duration and the first correspondence.

Figure 7A:
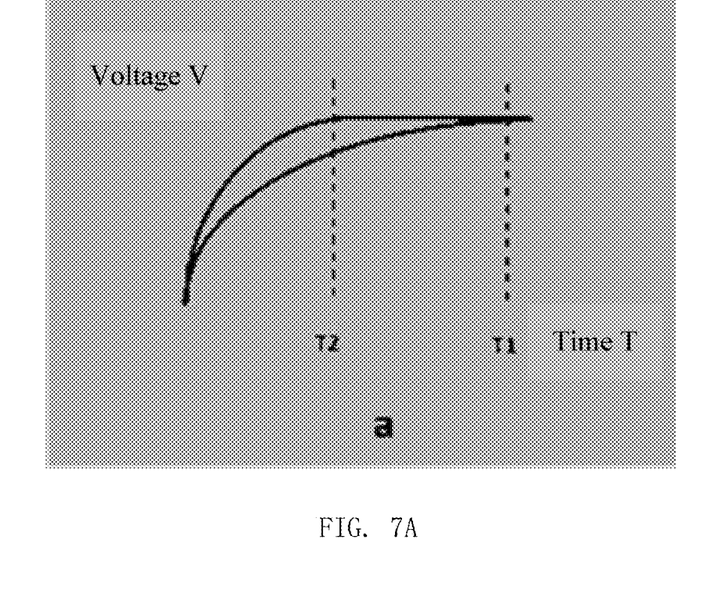
FIG. 7A is a schematic diagram of determining a pressure value in a first approach in some embodiments of the present disclosure.

In particular, FIG. 7A is a schematic diagram of determining a force touch value in the first approach in some embodiments of the present disclosure. As shown in FIG. 7A, in the first approach, a fixed standard voltage value is set (i.e., the voltage is fixed), and the magnitude of the touch pressure is determined based on the length of the charging time duration. If the pressure of the finger is small, the increase in the capacitance between the cathode and the metal plate of the middle frame is small and the charge may be finished in a short time (T2 in FIG. 7A), and if the pressure of the finger increases, the increase in the capacitance between the cathode and the metal plate of the middle frame is great and the capacitor may be charged to a preset voltage value in a longer time duration (T1 in FIG. 7A). In short, the longer the charging time duration, the greater the touch pressure may be; the shorter the charging time duration, the smaller the touch pressure may be.

In a second approach, the capacitance change data includes a voltage value that the capacitor in the charging state may reach at the end of a predetermined charging time duration, and the above-mentioned correspondence includes a second correspondence which is the correspondence between the above-mentioned voltage values and the pressure value. In this case, in determining the corresponding pressure value, it is possible to determine the pressure value corresponding to the above-mentioned voltage value based on the above-mentioned voltage value and the second correspondence.

Figure 7B:
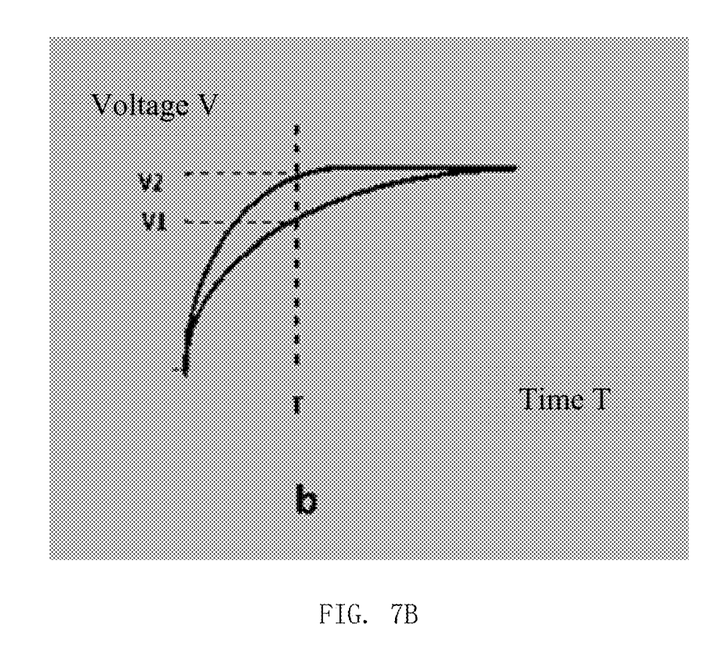
FIG. 7B is a schematic diagram of determining a pressure value in a second approach in some embodiments of the present disclosure.

To be specific, FIG. 7B is a schematic diagram of determining a force touch value in the second approach in some embodiments of the present disclosure. As shown in FIG. 7A, in the second approach, a fixed charging time duration is set (i.e., the charging time is fixed), and the magnitude of the touch pressure is determined based on the magnitude of the voltage used for charging the capacitor. If the touch pressure is small, the capacitor saturation value is small and the voltage between the two plates may reach V2 by charging the capacitor in a fixed time, and if the touch pressure is large, the capacitor saturation value is large and the voltage between the two plates may reach V1 in the fixed time. In short, based on different voltage values that the capacitor may reach in a unit time, different touch pressures may be distinguished and the discrimination of the force is greatly improved.

In addition, in the two approaches, the pressure in the z direction is obtained while the touch function may be realized through the co-ordinates on the x and y axes returned from the position where the pressed cathode (Sensor) is located. Apparently, the touch function may be realized in an ON CELL approach (embedding the touch screen between the color filter substrate and the polarizer), an OGS approach (forming the ITO conductive film and sensors directly on the protective glass) and so on, which is not repeated herein.

In the embodiments of the present disclosure, the cathode inside the display device provided with a display such as an AMOLED display is divided and reused so that each of the reused small cathodes is capable of forming a capacitive pressure sensor with the metal plate in the display device. By adopting this design, the Force Touch function may be incorporated into the module of the display device such as an AMOLED display without changing the mechanism design of the display device, and thus there is no assembly problem, and the touch pressure detection accuracy of the display device can be improved by the integrated Force Touch function.

The above-mentioned embodiments are merely optional embodiments of the present disclosure. It should be noted that improvements and modifications may be made by those skilled in the art without departing from the technical principles of the present disclosure. These improvements and modifications should also be considered within the scope of protection of the present disclosure.

What is claimed is:

1. A touch display device, comprising:
a metal layer, a cathode layer, and a plurality of organic light-emitting unit groups, wherein
the cathode layer comprises a plurality of cathodes, each of the plurality of organic light-emitting unit groups comprises a plurality of organic light-emitting units and the plurality of organic light-emitting units in each of the plurality of organic light-emitting unit groups shares one of the plurality of cathodes, the cathodes corresponding to the plurality of organic light-emitting unit groups are insulated from each other, and each of the plurality of cathodes forms a capacitive pressure sensor with the metal layer.

2. The touch display device according to claim 1, comprising a display area and a non-display area around the display area,
wherein each of the plurality of cathodes comprises a touch electrode and a signal lead configured to transmit an electrical signal, an end of the signal lead is electrically connected to the touch electrode and an opposite end of the signal lead extends to the non-display area.

3. The touch display device according to claim 2, wherein the signal leads extending towards four sides of the non-display area respectively are of an identical number.

4. The touch display device according to claim 3, wherein a material of the cathode comprises metal.

5. The touch display device according to claim 3, further comprising:
a driving module configured to apply a pressure scanning signal to each of the plurality of cathodes during a pressure scanning stage;
a detecting module configured to detect capacitance change data of a capacitor formed between each of the plurality of cathodes and the metal layer during the pressure scanning stage; and
a processing module configured to determine a corresponding pressure value based on the capacitance change data and a correspondence between capacitance change data and a pressure value.

6. The touch display device according to claim 2, wherein the signal lead and the touch electrode are arranged at an identical layer.

7. The touch display device according to claim 6, wherein a material of the cathode comprises metal.

8. The touch display device according to claim 6, further comprising:
a driving module configured to apply a pressure scanning signal to each of the plurality of cathodes during a pressure scanning stage;
a detecting module configured to detect capacitance change data of a capacitor formed between each of the plurality of cathodes and the metal layer during the pressure scanning stage; and
a processing module configured to determine a corresponding pressure value based on the capacitance change data and a correspondence between capacitance change data and a pressure value.

9. The touch display device according to claim 2, wherein the signal lead and the touch electrode are arranged at different layers.

10. The touch display device according to claim 9, wherein a material of the cathode comprises metal.

11. The touch display device according to claim 2, wherein a material of the cathode comprises metal.

12. The touch display device according to claim 2, further comprising:
 a driving module configured to apply a pressure scanning signal to each of the plurality of cathodes during a pressure scanning stage;
 a detecting module configured to detect capacitance change data of a capacitor formed between each of the plurality of cathodes and the metal layer during the pressure scanning stage; and
 a processing module configured to determine a corresponding pressure value based on the capacitance change data and a correspondence between capacitance change data and a pressure value.

13. The touch display device according to claim 1, wherein,
 the metal layer comprises a metal plate on a middle frame of the touch display device, and
 the metal layer is arranged at a side of the cathode layer away from the plurality of organic light-emitting units, an encapsulation layer configured to encapsulate the plurality of organic light-emitting units is arranged between the metal layer and the cathode layer, and a gap with a predetermined height exists between the metal layer and the cathode layer.

14. The touch display device according to claim 13, wherein the metal layer is spaced apart from the encapsulation layer.

15. The touch display device according to claim 1, wherein a material of the cathode comprises metal.

16. The touch display device according to claim 1, further comprising:
 a driving module configured to apply a pressure scanning signal to each of the plurality of cathodes during a pressure scanning stage;
 a detecting module configured to detect capacitance change data of a capacitor formed between each of the plurality of cathodes and the metal layer during the pressure scanning stage; and
 a processing module configured to determine a corresponding pressure value based on the capacitance change data and a correspondence between capacitance change data and a pressure value.

17. The touch display device according to claim 16, wherein the driving module is further configured to apply a common signal to each of the plurality of cathodes during a display stage.

18. A method of driving the touch display device according to claim 1, comprising:
 applying a common signal to each of the plurality of cathodes during a display stage;
 applying a pressure scanning signal to each of the plurality of cathodes during a pressure scanning stage;
 detecting capacitance change data of a capacitor formed between each of the plurality of cathodes and the metal layer during the pressure scanning stage; and
 determining a corresponding pressure value based on the capacitance change data and a correspondence between capacitance change data and a pressure value.

19. The method according to claim 18, wherein
 the capacitance change data comprises a charging time duration required for charging the capacitor to a predetermined voltage value, and the correspondence comprises a first correspondence which is a correspondence between the charging time duration and the pressure value, and
 the determining a corresponding pressure value comprises determining the pressure value corresponding to the charging time duration based on the charging time duration and the first correspondence.

20. The method according to claim 18, wherein
 the capacitance change data comprises a voltage value which a capacitor in a charging state reaches at an end of a predetermined charging time duration, and the correspondence comprises a second correspondence which is a correspondence between the voltage value and the pressure value, and
 the determining a corresponding pressure value comprises determining the pressure value corresponding to the voltage value based on the voltage value and the second correspondence.

* * * * *